United States Patent
Cohen et al.

(10) Patent No.: US 7,260,151 B2
(45) Date of Patent: Aug. 21, 2007

(54) DUAL PHASE PULSE MODULATION SYSTEM

(75) Inventors: Daniel S. Cohen, Baltimore, MD (US); John L. Fagan, Pasadena, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/961,980

(22) Filed: Oct. 8, 2004

(65) Prior Publication Data

US 2005/0078019 A1     Apr. 14, 2005

Related U.S. Application Data

(60) Provisional application No. 60/509,487, filed on Oct. 10, 2003, provisional application No. 60/510,740, filed on Oct. 10, 2003.

(51) Int. Cl.
*H04B 14/04*     (2006.01)

(52) U.S. Cl. .................................................. 375/242

(58) Field of Classification Search ................ 375/295, 375/242, 377, 238; 341/53, 52, 50, 68, 100, 341/101, 70; 332/109, 106; 342/175, 200, 342/201, 202; 307/212; 398/182, 183, 189
See application file for complete search history.

(56) References Cited

U.S. PATENT DOCUMENTS

| | | | | |
|---|---|---|---|---|
| 4,003,085 A | * | 1/1977 | Wu | 360/40 |
| 4,156,914 A | * | 5/1979 | Westell | 382/264 |
| 4,238,854 A | * | 12/1980 | Ehrsam et al. | 713/165 |
| RE30,482 E | | 1/1981 | Whitlock | 360/32 |
| 4,399,467 A | * | 8/1983 | Subramaniam | 382/244 |
| 4,420,976 A | * | 12/1983 | Orloff et al. | 73/304 C |
| 4,675,861 A | * | 6/1987 | Uttermark | 398/98 |
| 4,931,751 A | | 6/1990 | Keller et al. | 332/108 |
| 4,951,159 A | | 8/1990 | Van Beek | 358/455 |
| 5,027,372 A | | 6/1991 | Wong | 375/67 |
| 5,157,693 A | | 10/1992 | Lemersal, Jr. et al. | 375/67 |
| 5,625,645 A | | 4/1997 | Greier et al. | 375/276 |
| 5,640,160 A | * | 6/1997 | Miwa | 341/53 |
| 5,673,243 A | * | 9/1997 | Yanagi et al. | 369/59.24 |
| 5,696,790 A | * | 12/1997 | Graham et al. | 375/238 |
| 5,907,366 A | * | 5/1999 | Farmer et al. | 348/478 |
| 6,031,472 A | * | 2/2000 | Johnson et al. | 341/58 |
| 6,043,804 A | * | 3/2000 | Greene | 345/601 |
| 6,115,428 A | | 9/2000 | Kim | 375/308 |
| 6,212,230 B1 | * | 3/2001 | Rybicki et al. | 375/239 |

(Continued)

*Primary Examiner*—Pankaj Kumar
(74) *Attorney, Agent, or Firm*—Schneck & Schneck; Thomas Schneck

(57) ABSTRACT

A system configured to transmit and receive data signals over a data link in serial fashion using dual phase pulse modulation (DPPM) is described. The data link may be, for example, a one or two wire unshielded twisted pair (UTP) cable. An exemplary system includes a configurable interface able to accept parallel data from an external source, such as a microprocessor or an imaging device. The interface is externally programmable for a particular data format. An encoder is coupled to the configurable interface and converts parallel data into serial output data, the serial output data having high and low data pulses with each of the high and low data pulses encoded to have one of $2^M$ distinct data pulse widths. The system further includes a decoder coupled to the configurable interface, which is able to convert the serial input data into parallel data.

27 Claims, 3 Drawing Sheets

U.S. PATENT DOCUMENTS 6,473,252 B1* 10/2002 Graham ..................... 360/40
2003/0198478 A1 10/2003 Vrazel et al. ............... 398/183
2004/0095264 A1* 5/2004 Thomas ..................... 341/53

* cited by examiner

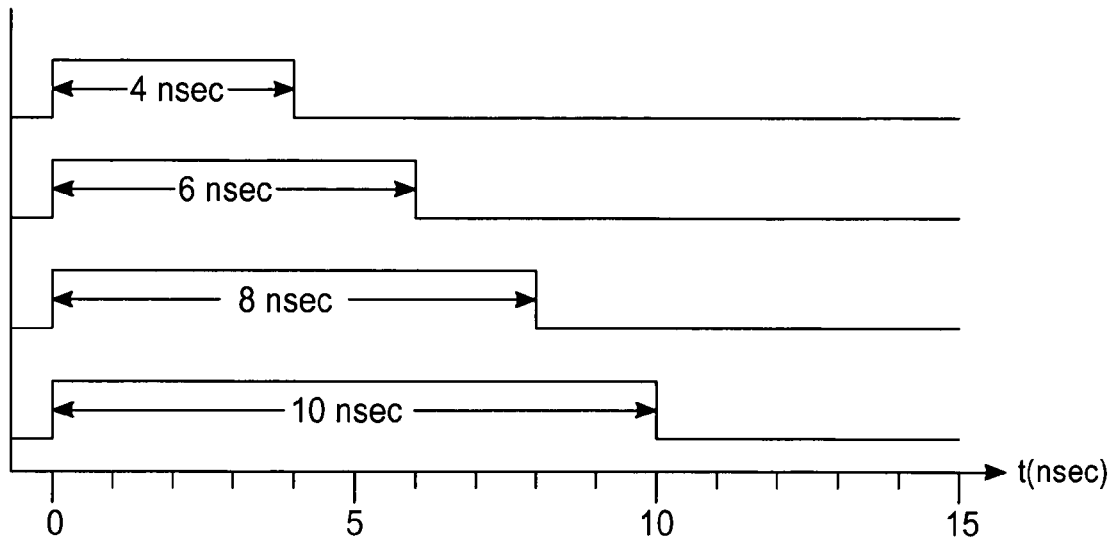
Fig._1
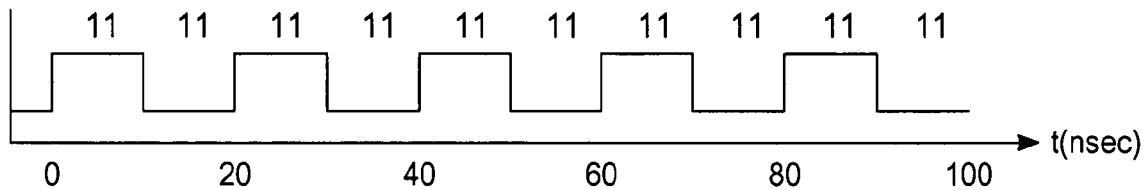
Fig._2A
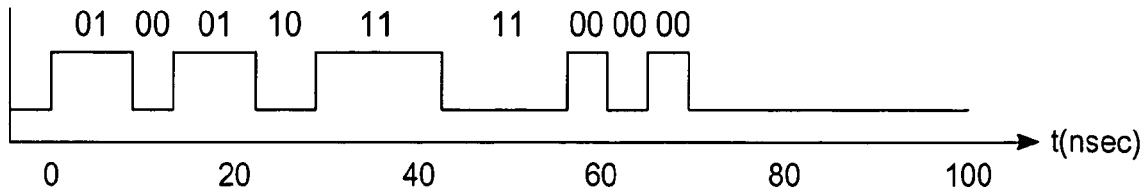
Fig._2B

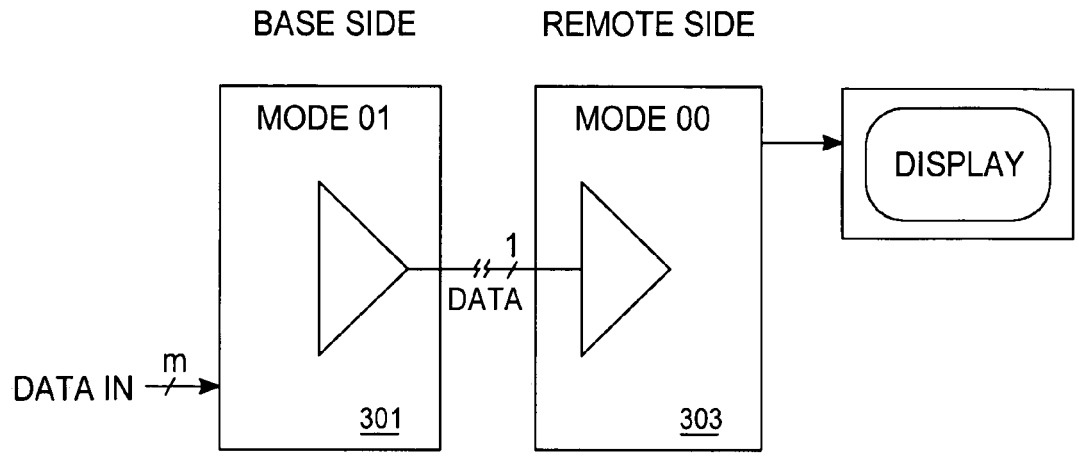
Fig._ 3A
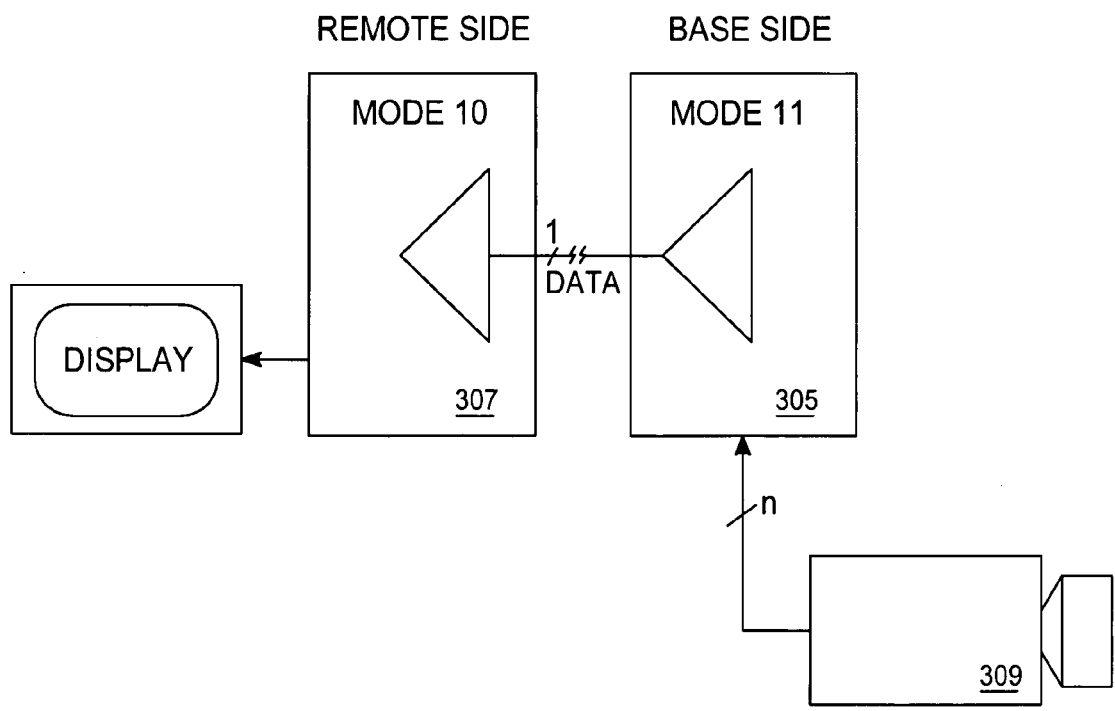
Fig._ 3B

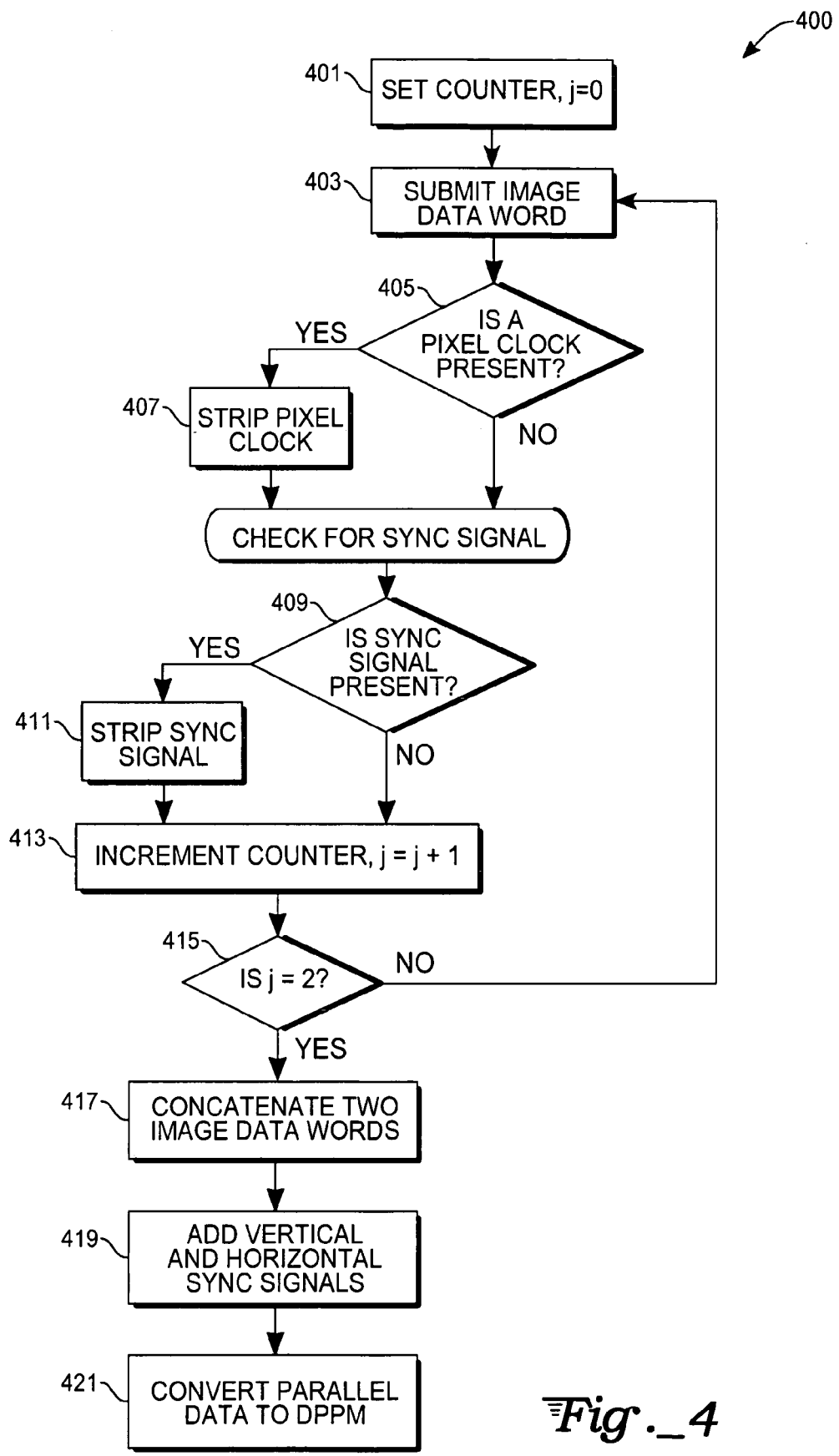
Fig._4

DUAL PHASE PULSE MODULATION SYSTEM

CROSS-REFERENCE TO RELATED APPLICATION

This application claims the benefit under 35 U.S.C. 119(e) from U.S. Provisional Patent Application Nos. and 60/509,487 and 60/510,740; both filed on Oct. 10, 2003.

TECHNICAL FIELD

Generally, the present invention relates to a programmable format of input and output data in a transmission of data across a link encoded and decoded using dual phase pulse modulation. Specifically, the present invention is a programmable dual phase pulse modulation system used to transmit and receive microprocessor and/or image-compatible data over a physical data link with minimum power utilization.

BACKGROUND ART

Different types of communication signals are typically classified according to certain basic characteristics, such as whether the signal carrier is amplitude modulated, angle modulated, pulse modulated, or some combination of these modulation types. In a pulse-modulated signal, the pulses may likewise be modulated in amplitude, duration (width), position (phase), repetition rate (interval), or any combination thereof. There may be a single channel or multiple channels of either analog, quantized or digital information modulating the carrier, and there may be various forms of multiplexing the information. The information may represent audio sound, video pictures, measurements, alphanumeric characters and symbols, other kinds of data, or some combination of these.

Pulse-duration modulation (PDM), also known as pulse-width modulation (PWM), is modulation of a pulse carrier wherein the value of the information signal modulating the carrier produces a pulse of proportional duration by varying the leading, trailing, or both edges of a pulse. Usually in PDM, the pulse spacing or interval remains constant. Pulse-spacing (or interval) modulation is a form of frequency modulation in which the spacing or interval between pulses is modulated in accord with an information value. Usually, the pulse duration or width remains constant in this modulation type. Pulse-position modulation (PPM) is phase modulation of a pulse carrier wherein the information value varies the position in time of a pulse relative to its unmodulated time of occurrence. This differs from pulse-spacing modulation in that PPM usually requires a reference clock in order to accurately judge a relative phase or position of the pulses.

"Keying" is any form of digital modulation in which signals are formed by modulating any characteristic of a carrier between discrete values. On/off keying is a binary form of amplitude-shift keying with two discrete states, one of which is the presence and the other the absence of energy in a keying interval. The information might be represented by a duration of one of the states (e.g., dots and dashes in Morse code telegraphy).

However, usually the amplitude state itself or the transition from one state to another represents encoded information. There are a variety of possible coding schemes (e.g., unipolar, polar, dipolar, return-to-zero, return-to-one, non-return-to-zero). For example, non-return-to-zero (NRZ) is a modulation mode in which it is not necessary for a signal to return to zero after each data element is encoded in the signal, whereas return-to-zero and return-to-one are modulation modes in which the signal does return to zero (or one) after each data element is encoded.

Frequency-shift keying (FSK) is a form of frequency modulation in which the modulated output signal shifts between two or more discrete predetermined frequencies in accord with a value of the information. In multiple-frequency-shift keying (MFSK), groups of n data bits are encoded by $2^n$ discrete frequencies. Phase-shift keying (PSK) is a form of phase modulation in which the modulating information shifts an instantaneous phase of a modulated signal between predetermined discrete phase values. Differential phase-shift keying (DPSK) is a form of PSK in which a reference phase for a given keying interval is the phase of the signal during the preceding keying interval. FSK and PSK modulation typically involve a continuous-wave carrier rather than pulses.

Multi-bit or N-ary (ternary, quaternary, octary, etc.) encoding schemes have modulated signals in which each signal condition (amplitude, frequency, phase) represents more than one bit of information. MFSK is one example, but PSK or DPSK could likewise have more than two discrete phases, e.g., 4 phases representing dibits. Each of the various forms of modulation has its own set of advantages and disadvantages relative to a specific application for which it will be used. Some factors to consider in choosing a particular form of modulation include bandwidth, power consumption requirements, and the potential for signal propagation errors and recovery of the original information. For digital data, whether a separate clock signal is required or the modulated signal is self-clocking may be important. The relative simplicity or complexity of modulating and demodulating equipment or circuitry may also be a factor in the decision. Low power consumption is particularly sought for use with capacitive-loaded transmission lines. Frequently, data are transmitted between a base unit and a remote unit. For example, these data may take a form of video or image data transmitted between a base or master location, and a remote or slave location. Such data need to be transmitted at low power to avoid the capacitive loading effect, described supra. Transmitting these data in a serial fashion allows transmission over existing data lines (e.g., data lines such as a unshielded twisted pair (UTP) line) but serial transmissions can be slow if improperly encoded. Therefore, efficient parallel to serial data encoding is advantageous. Further, it is be desirable for the master and slave locations to have an ability to reverse functions (i.e., the master becomes the slave and vice versa).

DISCLOSURE OF INVENTION

The present invention is a system configured to transmit and receive data signals over a data link. The data link may be, for example, a one or two wire unshielded twisted pair (UTP) cable. An exemplary system includes a configurable interface able to accept parallel data from an external source, such as a microprocessor or an imaging device. (Alternatively, the parallel data may be received from a source integrated with the interface circuitry.) The interface is externally programmable for a particular data format. An encoder is coupled to the configurable interface and converts parallel data into serial output data to be transmitted over the data link; the serial output data having high and low data pulses with each of the high and low data pulses encoded to have one of $2^M$ distinct data pulse widths. The system further includes a decoder coupled to the configurable interface, which is able to convert serial input data received over the data link into parallel data. Additionally, parallel data may then be output to external circuits.

The present invention is also a method for converting parallel image data into serial data signal. An exemplary method includes receiving parallel image data, stripping any pixel clock from the parallel image data (since a separate clock signal does not need to be transmitted), and converting the parallel image data into the serial data signal. The serial data signal has high and low data pulses. Each of the high and low data pulses is encoded to have one of $2^M$ distinct data pulse widths.

The present invention may also be used as a method for converting parallel microprocessor data into a serial data signal. An exemplary method includes receiving parallel microprocessor data, stripping any clock signal from the microprocessor data, stripping any chip select data from the microprocessor data, and converting parallel microprocessor data into the serial data signal. The serial microprocessor data has high and low data pulses. Each of the high and low data pulses is encoded to have one of $2^M$ distinct data pulse widths.

DETAILED DESCRIPTION OF THE DRAWINGS

FIG. 1 is a graphic illustration (signal value versus time) of a set of exemplary pulses of various pulse durations encoded by dual phase pulse modulation (DPPM) for representing a corresponding set of dibit data symbols in accord with an exemplary embodiment of the present invention.

FIGS. 2A and 2B are graphical illustrations of DPPM pulse trains in accord with an exemplary embodiment of the present invention for a set of exemplary data, showing transmission of a series of nine high- and nine low-going pulses within a single 100 nanosecond (nsec) system clock period.

FIG. 3A is a block diagram of an exemplary application of a DPPM used to transmit and receive microprocessor data.

FIG. 3B is a block diagram of an exemplary application of a DPPM used to transmit and receive image data.

FIG. 4 is a diagrammatic flow of an exemplary method for preparing image-based signals for transmission via DPPM in accord with the present invention.

BEST MODE FOR CARRYING OUT THE INVENTION

DPPM is a method of encoding data, resident in digital circuitry in the form of binary circuit states (ones and zeros), as a string of alternating high and low signal pulses whose respective durations or widths represent 2 (or more) bits of data per pulse. An exemplary embodiment of FIG. 1 uses 2 bits for encoding. The pairs of bits are encoded using a set of distinct pulse widths representing each possible dibit symbol value, such as:

00=4 ns pulse
01=6 ns pulse
10=8 ns pulse
11=10 ns pulse

The choice of 4, 6, 8, and 10 ns pulse widths is arbitrary and could just as well have been 4, 5, 6, and 7 ns or some other pulse widths, provided the decoding circuitry at the receiving end of a DPPM signal transmission can correctly distinguish the different pulse widths from each other. The decoding circuitry (in addition to inherent noise sources, signal degradation, and temperature/voltage variations in the propagating environment) also establishes a practical limit to the number of bits that can be encoded per pulse, with three bits per pulse having eight (i.e., $2^3$) possible pulse widths needing to be correctly resolved and four bits per pulse having 16 (i.e., $2^4$) possible pulse widths needing to be correctly resolved. The data rate can be considered to be the number of encoded bits per second, which is dependent on the number of pulses per system clock and the system clock frequency.

"Dual Phase" refers to the fact that the information is sent as both high-going pulses and the low-going pulses. Most pulse width modulation schemes simply vary a width of the high going pulse and therefore are really modulating a duty cycle. DPPM independently modulates the width of both high- and low-going pulses, with different groups of bits encoded in the high and low portions of each "cycle." Therefore, clock period and duty cycle are not valid concepts with respect to a generated DPPM pulse train. DPPM is by its nature "clockless," meaning the data can be decoded by simply detecting the width of the pulse with respect to each transition. This means that no clock need be sent with the data, nor must a clock be encoded and recovered from the data. This is a major advantage when transmitting time critical bursts between different chips, since it removes the necessity of manipulating a clock which would introduce opportunity for timing variance and error. The only clock consideration is the fact that several pulse "cycles" will be sent within each system clock period.

For example, FIGS. 2A and 2B show examples of DPPM pulse trains of alternating high and low pulses (five high pulses and four low pulses) transmitting 18 bits of data (organized here as nine dibits) in a 100 nsec system clock period. These 18 bits can form, for example, a 16-bit data word with two error correction code bits appended to the word. Thus one data word may be transmitted per system clock period.

Since information is sent on both high and low pulses of the pulse train, DPPM, in this embodiment, is by its nature a non-return-to-zero (or non-return-to-one) modulation scheme. However, the sequence of pulses contained within a system clock period may return to zero (or one) at the end of each such sequence. As indicated in the examples of FIGS. 2A and 2B, the number of multi-bit symbols in a word is represented by an odd number of pulses, thus allowing a final symbol in the sequence to have a return to zero (or return to one) as the trailing transition of the last pulse. Additionally, if the number of bits transferred resulted in a non-return-to-zero (or one) situation, an extra pulse may be inserted by the encoder and ignored by the decoder to force a return. The extra pulse, however, consumes additional power during which no real data is sent.

Thus, the DPPM method represents groups of M data bits, such as dibits (i.e., M=2), as signal pulses of specified widths. Each of the $2^M$ possible data values corresponds to one of $2^M$ distinct pulse widths as discussed supra, and successive groups of M data bits are represented by signal pulses that are alternately high and low (e.g., each high signal and each low signal represents a dibit in a case where M=2). Signal encoding and decoding circuitry performs the conversion between the data bit and signal pulse representations of the information content.

For encoding data bits as signal pulses, received data words are first subdivided into an ordered sequence of groups of M data bits, then each group in the sequence is converted into its corresponding signal pulse representation, thus producing a series of high and low signal pulses that represent the data. One way to perform the conversion of data words into signal pulses is to specify signal pulse transition times, each corresponding to a preceding transition time that is incremented by a specified pulse width corresponding to a present group of M data bits, and then producing signal pulse transitions at those specified transition times. Exemplary encoder hardware is described in detail in copending U.S. Published Patent Application No. 2004/50078021, filed Apr. 29, 2004, entitled "Dual Phase Pulse Modulation Encoder Implementation," (based on U.S. Provisional Patent Application No. 60/510,738) which is herein incorporated by reference, in its entirety.

For decoding a DPPM signal back into data, the pulse width for each of the high and low signal pulses is determined, then converted back into an ordered sequence of groups of M data bits, and recombined into data words. One way to perform this conversion is described in detail in U.S. Published Patent Application No. 2005/0078018, filed Apr. 29, 2004, (now U.S. Pat. No. 6,947,493 granted Sep. 20, 2005) entitled "Dual Phase Pulse Modulation Decoder Implementation," (based on U.S. Provisional Patent Application No. 60/509,487) which is herein incorporated by reference, in its entirety.

The present invention allows a format of data from a microprocessor or image-based system to be programmable. The transmission of data across a wire or cable is dual phase pulse modulated and therefore does not need a clock pulse transmitted to the receiving system.

In an exemplary embodiment, the present invention consists of a semiconductor circuit fabricated onto a chip and comprises both transmitter and receiver circuits in addition to encoder and decoder circuits.

The present invention allows for the circuit to be programmed to be either a transmitter or a receiver.

The circuit is capable, for example, of transmitting 16-bit microprocessor data and control signals or 8-bit image data and sync bits over a physical data link using only one or two physical data lines across the transmission (i.e., the master) and receiving (i.e., the slave) system. The data is encoded using dual phase pulse modulation, then decoded by the receiving circuit.

Each circuit can be programmed to be either a transmitter (TX) or receiver (RX) through an external programming signal. In addition, each circuit can be programmed to receive microprocessor or image-based data through another external signal. The external signal, in this example, can be transmitted as a single dibit according to table 1.

TABLE 1

| Signal (Dibit) | Mode | TX/RX |
|---|---|---|
| 00 | Microprocessor | RX |
| 01 | Microprocessor | TX |
| 10 | Image-based | RX |
| 11 | Image-based | TX |

In one example, a set of signals to be transmitted in a microprocessor mode are a 16-bit data, address bit, two chip selects, and microprocessor clock. Therefore, this example has 20-bits. The signal may be modified where a total number of data bits and the address bit is 17 address/data bits (eliminating any unnecessary chip selects, and the microprocessor clock pulse), thereby requiring nine dibits to be transmitted as a DPPM series of pulses.

The system of the present invention is highly configurable, allowing the system to interface with many microprocessor and image-based interfaces. The configuration allows the polarity of each image-based signal to be inverted. It also allows the format of microprocessor signals to be modified to eliminate unnecessary bits.

In an exemplary microprocessor mode, the microprocessor/image interface block translates the 20 microprocessor signals to an 18-bit word to be transmitted. When in microprocessor mode, the interface decodes two chip selects and microprocessor clock into one bit of data. This bit essentially indicates which chip select is active. If no chip select is active or if there is no microprocessor clock, no data is transmitted across a link. This results in lower power dissipation across a link. The microprocessor clock and two chip selects are regenerated in the receiving unit, with the timing necessary to be compatible with an external interface. The system clock is used to create the necessary timing. The control signals are encoded such that the information can be regenerated on the receiving system. This encoded data allows for data to be regenerated into another format of the receiving system, allowing for data format modification with no additional circuitry.

An exemplary set of signals to be transmitted in an image-based mode are an eight bit data, horizontal sync, vertical sync, and pixel clock for total of 11-bits. In a particular embodiment, the image-based interface operates at twice the system clock frequency. In this exemplary image-based mode, the interface concatenates two blocks of 11-bit image signals into an 18-bit word to be transmitted (i.e., the two 8-bit words of data along with one horizontal and one vertical sync signal). The pixel clock is not sent, but may be regenerated using the system clock in the receiving unit. The 18-bit data are encoded using dual phase pulse modulation on the transmitting unit. On the receiving unit, the dual phase pulse modulation data are decoded back into 18-bit parallel data.

With respect to FIG. 3A, an exemplary application of a DPPM system used to transmit and receive microprocessor data includes a base DPPM circuit 301 and a remote DPPM circuit 303. Here, an external programming signal, described supra, is sent to the base circuit 301 and the remote circuit 303 to configure each circuit; the base circuit 301 is configured as a microprocessor master transmitting circuit and the remote circuit 303 is configured as a microprocessor slave receiving circuit. Once a parallel data signal is received on an m-wide parallel data bus, unnecessary data (e.g., a clock signal) are stripped and the DPPM circuit converts the parallel data string into a serial stream of data pulses with $2^M$ distinct pulse widths, described supra.

The block diagram of an exemplary application of a DPPM system used to transmit and receive image data, FIG. 3B, includes a base DPPM circuit 305, a remote DPPM circuit 307, and an imaging device 309, such as an imaging camera. As with the microprocessor circuit above, an external programming signal is sent to the base circuit 305 and the remote circuit 307 to configure each circuit; the base circuit 305 is configured as an image-based master transmitting circuit and the remote circuit 307 is configured as an image-based slave receiving circuit. FIG. 4 describes an exemplary method 400 for preparing image-based signals for transmission via DPPM in accordance with the present invention.

With reference to FIG. 4, an initial word counter index, j, is set to zero 401. Parallel image data are submitted to the base circuit 305 (FIG. 3) from the imaging device 309 on an n-wide parallel path. For this example, n carries an eight-bit word. A determination is made 405 whether a pixel clock is present. If a pixel clock is found, the clock is stripped 407. A determination is then made 409 if either a vertical and/or horizontal synchronization ("sync") signal is present (as described infra, each transmitted DPPM string requires only a single vertical and horizontal sync signal for each concatenated data word). If one or more sync signals are present, they are stripped 411 and the word counter index is incremented 413. A determination is made 415 whether the word counter is equal to "2." If not, another image word is submitted and steps 403-415 are repeated. Once the word-counter index, j, equals "2," then the two image words are concatenated 417. The concatenated data are appended 419 with a single vertical and a single horizontal sync signal. The parallel data are then converted 421 to a serial DPPM data stream as described herein.

Although the present invention has been described in terms of specific exemplary embodiments, one skilled in the art will readily recognize that alternative forms of the DPPM system and method may be readily conceived and still be within a scope of the present invention. For example, reference has been made to dibits being transmitted (i.e., M equals "2"). Although M is typically an integer, M could easily be an integer greater than two. Additionally, the exemplary DPPM systems have been described in terms of transmitting and receiving microprocessor and image-based data. However, one skilled in the art can readily envision other types of data being readily adaptable to a DPPM system and format. Therefore, the scope of the present invention shall only be limited by the appended claims.

What is claimed is:

1. An electronic circuit configured to transmit data signals over a data link, comprising:
    a configurable interface configured to accept data from an external source, the interface being externally programmable for a particular data format;
    means for stripping any clock signal from the data from the external source; and
    an encoder coupled to the configurable interface and configured to convert parallel data into serial output data, the serial output data having high and low data pulses with each of the high and low data pulses encoded to have one of $2^M$ distinct data pulse widths where M is an integer greater than or equal to one.

2. The system of claim 1 wherein the external source is a microcontroller.

3. The system of claim 1 wherein the external source is an imaging device.

4. The system of claim 1 wherein the configurable interface is configured to accept microprocessor data.

5. The system of claim 1 wherein the configurable interface is configured to accept image-based data.

6. The system of claim 1 wherein M has a value of two.

7. A system configured to receive data signals over a data link, comprising:
    a configurable interface configured to accept serial data through a serial data input, the interface being externally programmable for a particular data format;
    wherein the serial data accepted through the serial data input is originally parallel data from which is stripped any clock signals, and
    a decoder coupled to an output of the interface, the decoder configured to receive a signal consisting of a series of alternately high and low signal pulses of specified widths corresponding to M-bit groups of data bite, with each of the high and low data pulses having one of $2^M$ distinct data pulse widths where M is an integer greater than or equal to one, the decoder further configured to convert the serial data into parallel data.

8. The system of claim 7 wherein the external source is a microcontroller.

9. The system of claim 7 wherein the external source is an imaging device.

10. The system of claim 7 wherein the configurable interface is configured to accept microprocessor data.

11. The system of claim 7 wherein the configurable interface is configured to accept image-based data.

12. The system of claim 7 wherein M has a value of two.

13. A system configured to transmit and receive data signals over a data link, comprising:
    a configurable interface configured to accept parallel data from an external sources the interface being externally programmable for a particular data format;
    means for stripping the parallel data of any clock signal;
    an encoder coupled to the configurable interface and configured to convert parallel data into serial output data, the serial output data having high and low data pulses with each of the high and low data pulses encoded to have one of $2^M$ distinct data pulse widths where M is an integer greater than or equal to one; and
    a decoder coupled to the configurable interface and configured to convert the serial output data into parallel data.

14. The system of claim 13 wherein the external source is a microcontroller.

15. The system of claim 13 wherein the external source is an imaging device.

16. The system of claim 13 wherein the configurable interface is configured to accept microprocessor data.

17. The system of claim 13 wherein the configurable interface is configured to accept image-based data.

18. The system of claim 13 wherein M has a value of two.

19. A method for converting parallel image data into serial image data, comprising:
    receiving parallel image data:
    stripping any pixel clock from the parallel image data; and
    converting the parallel image data into serial data, the serial data having high and low data pulses with each of the high and low data pulses encoded to have one of $2^M$ distinct data pulse widths where M is an integer greater than or equal to one.

20. The method of claim 19 further comprising stripping any synchronization signal from the parallel image data.

21. The method of claim 20 further comprising concatenating two or more parallel image data words, the words having been stripped of any synchronization signals.

22. The method of claim 21 further comprising appending a single horizontal synchronization signal and a single vertical synchronization signal to the concatenated image data.

23. The method of claim 19 wherein M has a value of two.

24. A method for converting parallel microprocessor data into serial microprocessor data, comprising:
    receiving parallel microprocessor data;
    stripping any clock signal from the microprocessor data;
    stripping any chip select data from the microprocessor data; and
    converting the parallel microprocessor data into serial data, the serial data having high and low data pulses with each of the high and low data pulses encoded to have one of $2^M$ distinct data pulse widths where M is an integer greater than or equal to one.

25. The method of claim 24 wherein M has a value of two.

26. A method for converting parallel data signals into a serial data signal, comprising:
   receiving parallel data;
   stripping any clock signals from the parallel data; and
   converting the parallel data into serial data, the serial data having high and low data pulses with each of the high and low data pulses encoded to have one of $2^M$ distinct data pulse widths.

27. The method of claim 26 wherein M has a value of two.

* * * * *